US009312897B2

(12) United States Patent
Steele et al.

(10) Patent No.: US 9,312,897 B2
(45) Date of Patent: Apr. 12, 2016

(54) DC OFFSET FILTER FOR WIDE BAND BEAMFORMING RECEIVERS

(71) Applicant: QUALCOMM Incorporated, San Diego, CA (US)

(72) Inventors: Gregory Steele, Pleasanton, CA (US); Yossi Tsfati, Haifa (IL); Haim M Weissman, Haifa (IL); Mazhareddin Taghivand, Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 335 days.

(21) Appl. No.: 13/664,678

(22) Filed: Oct. 31, 2012

(65) Prior Publication Data

US 2014/0120851 A1    May 1, 2014

(51) Int. Cl.
*H04B 1/10* (2006.01)
*H03D 3/00* (2006.01)

(52) U.S. Cl.
CPC ............. *H04B 1/1036* (2013.01); *H03D 3/008* (2013.01); *H03D 2200/0043* (2013.01); *H03D 2200/0047* (2013.01); *H04B 2001/1063* (2013.01)

(58) Field of Classification Search
CPC ............ H03D 2200/009; H03D 3/008; H03D 2200/0047
USPC ........................................ 455/90.2, 306, 307
See application file for complete search history.

(56) References Cited

U.S. PATENT DOCUMENTS

| 6,335,656 | B1 * | 1/2002 | Goldfarb et al. ............ 327/559 |
| 6,356,748 | B1 | 3/2002 | Namgoong et al. | |
| 6,862,439 | B2 | 3/2005 | Feng | |
| 7,373,127 | B2 | 5/2008 | Reed | |
| 7,705,761 | B2 | 4/2010 | Tietjen et al. | |
| 8,098,782 | B2 | 1/2012 | Chamberlain | |
| 8,121,575 | B2 * | 2/2012 | Ruijter ......................... 455/296 |
| 2002/0057751 | A1 * | 5/2002 | Jagger et al. .................. 375/346 |
| 2002/0123319 | A1 * | 9/2002 | Peterzell ....................... 455/296 |
| 2002/0132597 | A1 * | 9/2002 | Peterzell et al. .............. 455/130 |
| 2002/0168956 | A1 * | 11/2002 | Murtojarvi .................... 455/296 |
| 2003/0017817 | A1 * | 1/2003 | Cowley ......................... 455/323 |
| 2004/0087290 | A1 * | 5/2004 | Schmidt et al. ............... 455/213 |
| 2005/0094744 | A1 | 5/2005 | Ramachandran et al. | |

(Continued)

FOREIGN PATENT DOCUMENTS

| EP | 1841085 A1 | 10/2007 |
| WO | 02056490 | 7/2002 |
| WO | 2004059861 A1 | 7/2004 |

OTHER PUBLICATIONS

International Search Report and Written Opinion—PCT/US2013/067868—ISA/EPO—Jan. 8, 2014.
IEEE P802.11ad/D5.0, Sep. 2011, Draft Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 3: Enhancements for Very High Throughput in the 60 GHz Band, 601 pages.

(Continued)

*Primary Examiner* — Bobbak Safaipour
*Assistant Examiner* — Devan Sandiford
(74) *Attorney, Agent, or Firm* — Linda G. Gunderson

(57) ABSTRACT

A DC offset filter for wide band beamforming receivers is disclosed. In an exemplary embodiment, an apparatus includes a first mixer configured to down-convert an RF wideband beamformed signal to generate a first baseband wideband beamformed signal, the RF wideband beamformed signal having a beam pattern selected from a plurality of beam patterns, and a notch filter configured to remove DC offset from the first baseband wideband beamformed signal independent of the beam pattern.

10 Claims, 3 Drawing Sheets

(56) References Cited

U.S. PATENT DOCUMENTS

| | | | |
|---|---|---|---|
| 2006/0058001 A1* | 3/2006 | Minnis et al. | 455/334 |
| 2006/0245474 A1* | 11/2006 | Brunel et al. | 375/146 |
| 2007/0069716 A1* | 3/2007 | Sleeman et al. | 324/99 D |
| 2007/0105519 A1* | 5/2007 | Perkins | 455/295 |
| 2008/0123614 A1* | 5/2008 | Iida | 370/343 |
| 2008/0139119 A1* | 6/2008 | Behzad et al. | 455/41.2 |
| 2009/0325532 A1* | 12/2009 | Nekhamkin et al. | 455/307 |
| 2010/0233971 A1* | 9/2010 | Vassiliou et al. | 455/73 |
| 2012/0178386 A1* | 7/2012 | Pascolini et al. | 455/84 |
| 2012/0269307 A1* | 10/2012 | Ozgun et al. | 375/350 |
| 2013/0225101 A1* | 8/2013 | Basaran et al. | 455/79 |
| 2013/0241666 A1* | 9/2013 | Granger-Jones et al. | 333/101 |

OTHER PUBLICATIONS

IEEE Std 802.15.3c: "Part 15.3: Wireless Medium Access Control (MAC) and Physical Layer (PHY) Specifications for High Rate Wireless Personal Area Networks (WPANs)," Amendment 2: Millimeter-wave-based, Alternative Physical Layer Extension, (Amendment to IEEE Std 802.15.3-2003), Oct. 12, 2009, pp. 1-187.

\* cited by examiner

DC OFFSET FILTER FOR WIDE BAND BEAMFORMING RECEIVERS

BACKGROUND

1. Field

The present application relates generally to the operation and design of analog front ends, and more particularly, to the operation and design of wide band beamforming receivers.

2. Background

In wideband direct conversion receivers employing radio frequency (RF) beamforming, local oscillator (LO) leakage paths through the receiver can give rise to beam dependent DC offset. For example, LO leakage may affect the operation of a phase shifter, power combiner, or the downconverter in the receive chain. As a result, the down-converted signal may include DC offset attributable to this leakage. Furthermore, the DC offset may be beam dependant and therefore different offsets may result based on the selected beam direction or beam pattern.

In some conventional systems, digital filters are used to mitigate DC offset. For example, an analog-to-digital converter (ADC) is used to convert the analog down-converted signal to a digital signal for further processing. To mitigate the DC offset, digital filters are inserted after the ADC. However, such filters do not help if the DC offset saturates the ADC. Furthermore, the digital filters typically provide a wideband notch that can impact single-carrier performance.

In other conventional systems, a beam dependent calibration is employed to cancel the DC offset. In these systems, digital-to-analog converters (DAC) are programmed to provide correction values that are used in the receive signal path to cancel the DC offset. However, this solution is inefficient in that it is time-consuming to calibrate all the correction values for a large number of beam directions or beam patterns. Furthermore this solution is complex to implement in that additional circuitry may be needed to store and switch different DC correction values into the receive chain whenever the beam direction/pattern is changed.

Accordingly, it would be desirable to have a simple and efficient mechanism to remove or reduce DC offset in wideband direct conversion receivers employing RF beamforming.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
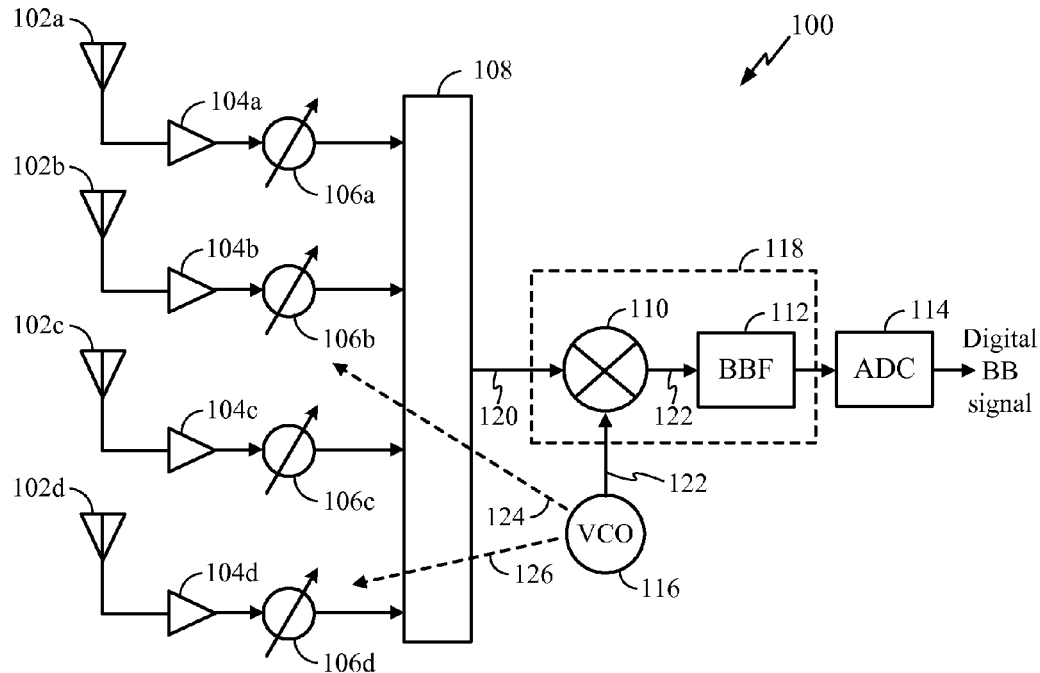
FIG. 1 shows a conventional wide band beamforming receiver.

FIG. 1 shows a conventional wideband direct conversion receiver 100 employing RF beamforming for use in a wireless device. Multiple antennas 102(a-d) each receive wideband RF signals that are input to low noise amplifiers 104(a-d). The outputs of the LNAs 104 are input to phase shifters 106(a-d) that phase shift these received RF signals with selected amounts of phase shift associated with a desired beam pattern/direction. By providing the appropriate phase shifts, the phase shifters 106 can generate a particular beam pattern/direction that is selected from a plurality of possible beam patterns/direction.

The phase shifted signals output from the phase shifters 106 are combined by a signal combiner 108 to generate an RF wideband beamformed signal 120. The beamformed signal 120 is input to a mixer 110 that performs a down-conversion using a local oscillator (LO) signal 122 generated by a voltage controlled oscillator (VCO) 116. The mixer 110 generates a baseband beamformed signal 122 that is filtered by a baseband filter (BBF) 112 and digitized by an analog to digital filter (ADC) 114 to generate a digital BB signal that can be further processed by the wireless device.

During operation, it is possible that leakage from the oscillator 116 appears at various functional modules of the receiver 100. For example, the receiver 100 may perform direct down-conversion and so the frequency of the LO signal may be within the band of interest. The leakage paths 124, 126 illustrate how LO leakage may propagate to appear at other functional modules of the receiver 100. The LO leakage may result in a DC offset that appears in the baseband beamformed signal 122 that is output from the mixer 110. The amount of DC offset may change with the selected beam pattern/direction so that digital filtering or per beam calibration to remove the DC offset would be difficult, complicated, time consuming, and inefficient.

Accordingly, in various exemplary embodiments, a novel DC offset filter for use with wide band beamforming receivers is disclosed. The DC offset filter operates to reduce or remove DC offset from the baseband beamformed signal 122 that is output from the mixer 110 independent of the selected beam pattern/direction. In an exemplary embodiment, the DC offset filter is provided within an analog baseband processing section 118 before the received signal is digitized by the ADC 114.

Figure 2:
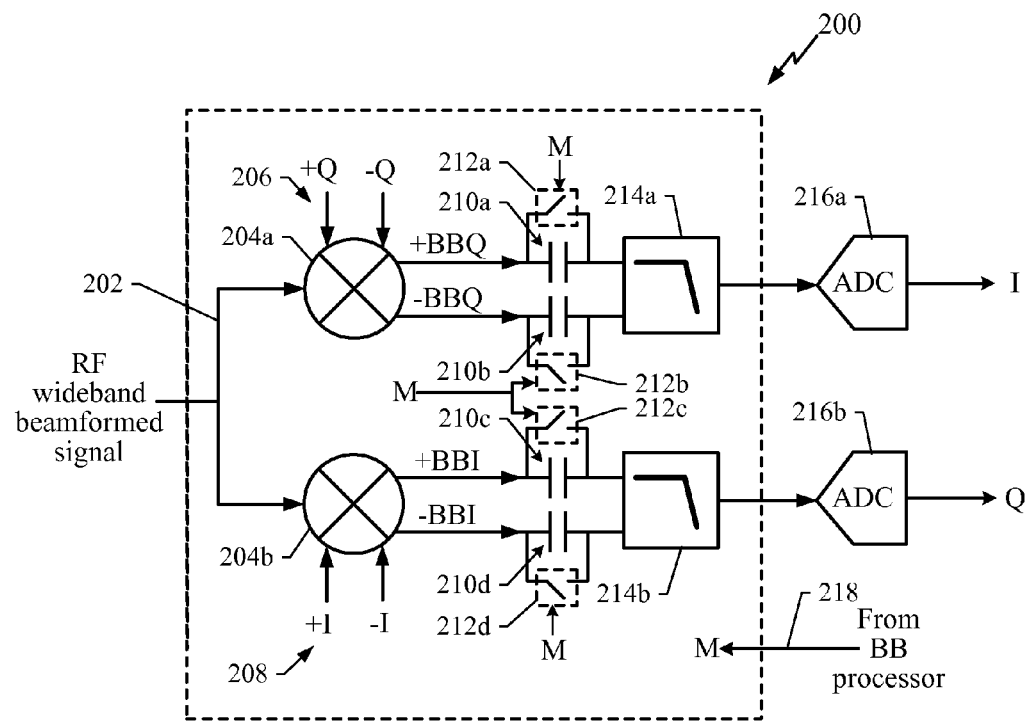
FIG. 2 shows an exemplary embodiment of a novel analog processing section for use in a wide band beamforming receiver to reduce or remove DC offset.

FIG. 2 shows a detailed exemplary embodiment of an analog baseband processing section 200 for use in a wireless device. For example, the processing section 200 is suitable for use as the baseband processing section 118 shown in FIG. 1. In an exemplary embodiment the processing section 200 is configured to reduce or remove DC offset from a baseband beamformed signal regardless of the selected beam pattern/direction.

An RF wideband beamformed signal 202 is received at mixers 204(a-b). For example, the RF wideband beamformed signal 202 may be formed by the antennas 102, LNA 104, phase shifters 106, and combiner 108 shown in FIG. 1 and may have any desired beam pattern/direction selected from a plurality of possible beam pattern/directions. The mixers 204 receive I 206 and Q 208 local oscillator signals and use these signals to down-convert the RF beamformed signal 202 to generate differential baseband beamformed signals (BBQ and BBI). For example, the I 206 and Q 208 local oscillator signals are generated by the VCO 116 shown in FIG. 1.

The baseband beamformed signals (BBI and BBQ) are input to notch filters 210(a-d). The notch filters 210 operate to reduce or remove DC offset that may be part of the beamformed baseband signals (BBI and BBQ). In an exemplary embodiment, the notch filters 210 comprise DC blocking capacitors having fixed capacitance values in the approximate range of 50 fF to 1 pF. In other exemplary embodiments, the capacitance values of the DC blocking capacitors forming the notch filters 210 can be set to other capacitance values. In various exemplary embodiments, the corner frequency of the notch filters 210 is determined by the input impedance of the analog baseband circuit. In an exemplary embodiment, the corner frequency is set to approximately 300 kHz.

The outputs of the notch filters 210 are input to baseband filters 214(a-b) that perform low pass filtering prior to digitization. The outputs of the baseband filters 214 are input to ADC 216(a-b) that digitize the filtered signals to generate digital signals I and Q that are further processed by the wireless device.

Since the notch filters 210 operate to filter a narrow band around DC and the baseband beamformed signals (BBQ and BBI) are wideband signals, the notch filters 210 are able to reduce or remove DC offset with little or no affect on the overall frequency band. Furthermore, the notch filters 210 are effective in reducing or removing DC offset independent of the selected beam patter/direction. In another exemplary embodiment, the notch filters 210 are placed between the baseband filters 214 and the ADCs 216. As a result, the signals input to the ADCs 216 have little or no DC offset.

The processing section 200 also comprises bypass switches 212(a-d). The bypass switches 212 are configured to open and close in response to a mode signal (M) 218 received from a BB processor or other entity at the wireless device. For example, the bypass switches 212 may be used during a transmit calibration mode, where a signal transmitted from the wireless device is also received and processed by the processing section 200 for calibration purposes. The mode signal 218 is set to close the bypass switches 212 so that the notch filters 210 are bypassed. This allows the transmit calibration to occur without the removal of DC offset in the beamformed baseband signals (BBQ and BBI). It should be noted that the bypass switches may be used to bypass the notch filters 210 for any desired purpose or function and are not limited to use during calibration modes.

During a wideband receive mode, the mode signal 218 is set to open the bypass switches 212 so that the notch filters 210 are not bypassed and therefore enabled into the receive chain. This allows the reduction or removal of DC offset from the beamformed baseband signals (BBQ and BBI) to occur.

Therefore, in various exemplary embodiments, a novel analog processing section 200 comprising DC offset filters for use in wide band beamforming receivers is provided. In an exemplary embodiment, the DC offset filters operates to reduce or remove DC offset from baseband beamforming signals (BBQ and BBI) that are output from direct down-converting mixers 204 independent of the selected beam pattern/direction. In additional exemplary embodiments, the DC offset filters includes bypass switches 212 that operate to disable DC offset filtering during various operational modes, such as during a transmit calibration mode.

Figure 3:
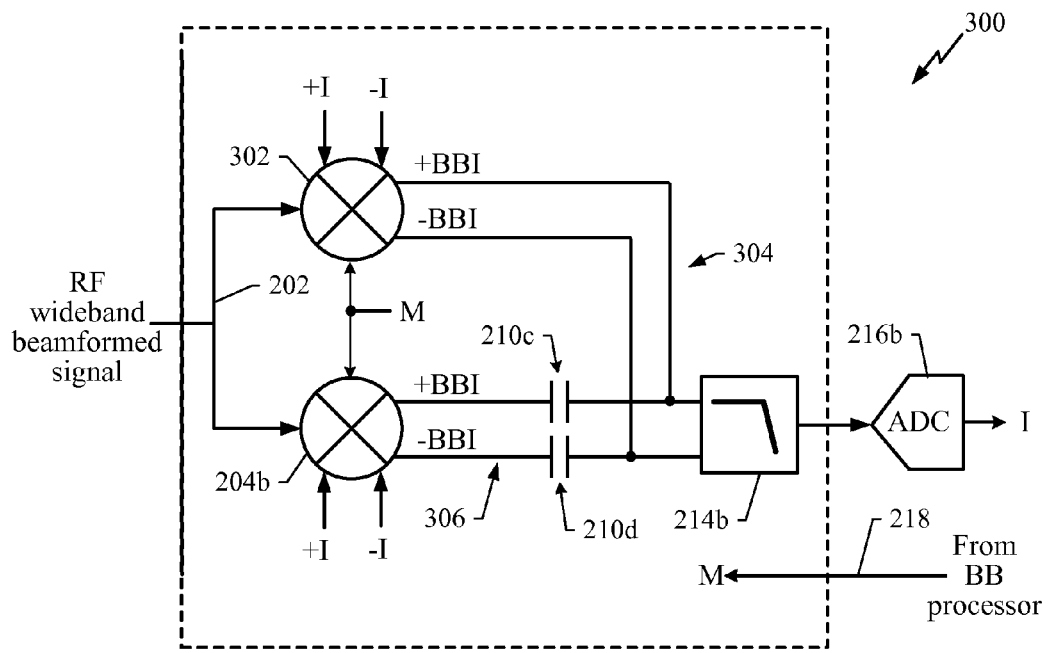
FIG. 3 shows an exemplary embodiment of an alternative analog processing section.

FIG. 3 shows an exemplary embodiment of an alternative analog processing section 300. For simplicity, the alternative processing section 300 is shown with respect to processing in-phase (I) signals; however, the alternative processing section 300 can easily be extended and applied to the circuitry configured to process the quadrature (Q) phase signals as well.

The alternative processing section 300 comprises a second or parallel mixer 302 that receives the RF wideband beamformed signal 202 and generates a second or parallel baseband beamformed signals (BBI) 304. The second baseband beamformed signals (BBI) 304 are identical to the first BBI signals 306 output from the first mixer 204b. The second baseband beamformed signals (BBI) 304 are input to the BBF 214b. In an exemplary embodiment, the mode signal 218 is configured to enable one of the mixers 204b, 302 to output its beamformed baseband signals to the BBF 214b. When the mixer 204b is enabled and the second mixer 302 is disabled, the down-converted baseband signals 306 are filtered by the notch filters 201(c, d) before being input to the BBF 214b. When the second mixer 302 is enabled and the first mixer 204b is disabled, the second down-converted baseband signals 304 are input to the BBF 214b without any notch filtering applied. Thus, no DC offset filtering is utilized when the second mixer 302 is enabled by the mode signal 218.

Figure 4:
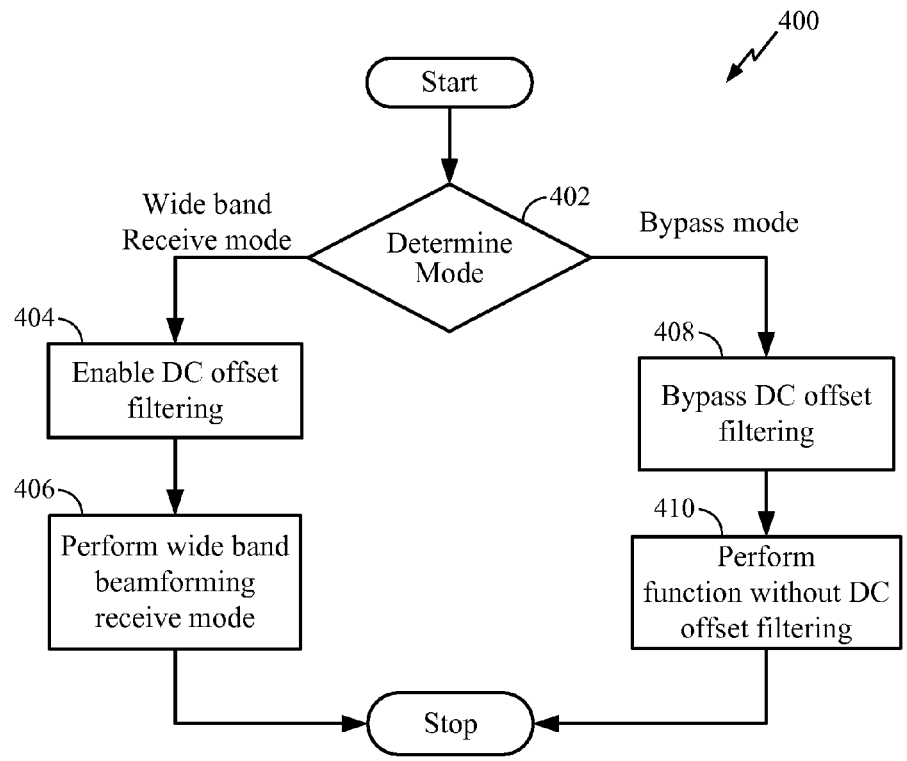
FIG. 4 shows an exemplary embodiment of a method for operating a wide band beamforming receiver comprising a novel analog processing section to reduce or remove DC offset.

FIG. 4 shows an exemplary method for operating a wide band beamforming receiver comprising a novel analog processing section to reduce or remove DC offset. For example, the method 400 is suitable for use by the processing section 200 shown in FIG. 2 or the processing section 300 shown in FIG. 3.

At block 402, an operating mode for a wide band beamforming receiver is determined. In an exemplary embodiment, the mode signal 218 is set by a baseband processor to indicate an operating mode for the processing section 200. For example, the mode signal 218 can be set to indicate a DC filter bypass mode or a wide band beamforming receive mode. If the wide band receive mode is determined, the method proceeds to block 404. If the DC filter bypass mode is determined, the method proceeds to block 408.

At block 404, a wide band receive mode having DC offset filtering is enabled. In an exemplary embodiment, the filter bypass switches 212 are set to enable DC offset filtering. For example, the mode signal 218 is set to open the switches 212 to enable the notch filters 210 into the receive chain of the processing section 200. In another exemplary embodiment, the mode signal 218 of the processing section 300 is set to disable the parallel mixer 302 and enable the mixer 204b to output baseband beamformed signals 306 as input to the notch filters 210.

At block 406, wide band beamforming receive mode is performed. In an exemplary embodiment, a wide band beamformed signal is received and processed. The notch filters 210 operate to reduce or remove DC offset from the baseband beamformed signals (BBQ and BBI) independent from the selected beam patter/direction.

At block 408, DC offset filtering is bypassed. In an exemplary embodiment, the filter bypass switches are set to disable DC offset filtering. For example, the mode signal 218 is set to close the switches 212 to bypass the notch filters 210 in the processing section 200. In another exemplary embodiment, the mode signal 218 of the processing section 300 is set to disable the mixer 204b and enable the second mixer 302 to output the baseband beamformed signals 304 as input to the notch filters 210 thereby bypassing the notch filters 210.

At block 410, a transceiver function is performed without DC offset filtering. For example, transmitter calibration or other functions can be performed without DC offset reduction. For example, in a transmit calibration mode, a self-transmitted signal is received and processed without DC offset reduction to facilitate the calibration process.

Therefore, the method 400 provides operation of a novel processing section having a DC offset filter in a wide band beamforming receiver. It should be noted that the method 400 is just one implementation and that the operations of the method 400 may be rearranged or otherwise modified such that other implementations are possible.

Figure 5:
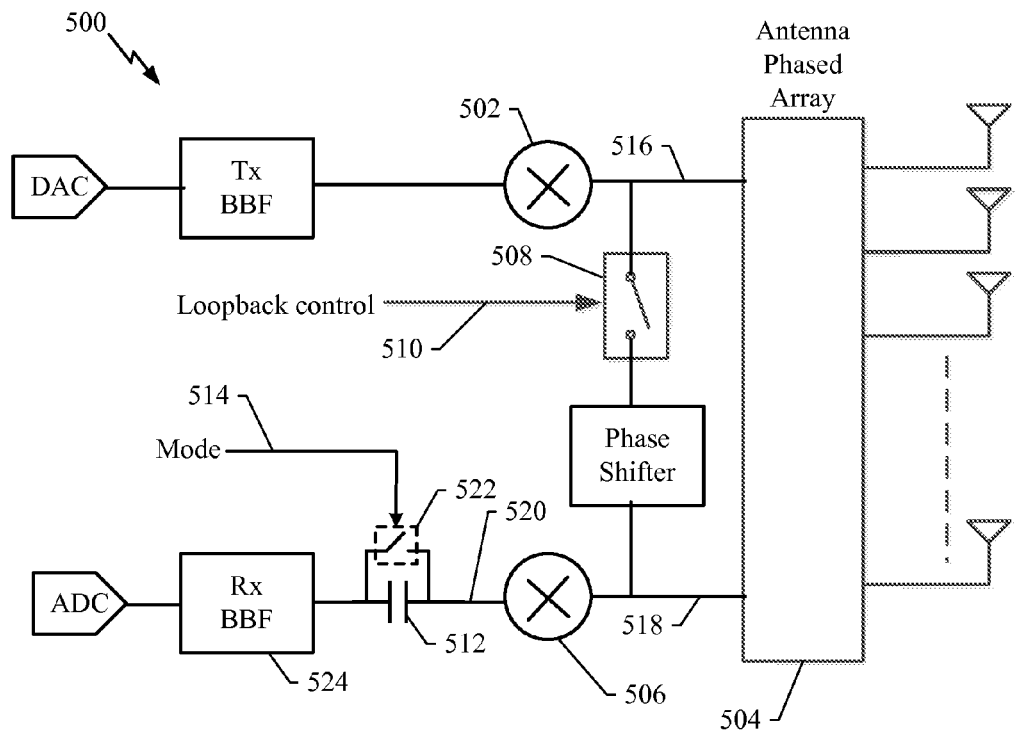
FIG. 5 shows a transceiver configured in a loop-back configuration that includes an exemplary embodiment of a notch filter.

FIG. 5 shows a transceiver 500 configured in a loop-back configuration that includes an exemplary embodiment of a notch filter 512. The transceiver 500 comprises a transmit signal path where a baseband transmit signal is up-converted by up-converter 502 to generate an RF transmit signal 516 that is input to a phase antenna array 504. In a receive mode, the antenna array 504 receives RF signals from multiple antennas and combines these RF signals into a beamformed RF signal 518 that is input to a downconverter 506. The downconverter 506 down-converts the received beamformed RF signal to a beamformed baseband signal 520. The beamformed baseband signal 520 is input to the notch filter 512 and the output of the filter is input to a receiver BBF 524. The notch filter 512 comprises any of the notch filter implementations described herein.

A bypass switch 522 is coupled across the notch filter 512 and operates to bypass the notch filter 512 based on the state of a mode signal 514. For example, the mode signal 514 may be the mode signal 218 shown in FIG. 2.

The transceiver 500 also comprises a loopback switch 508 that is configured to loop back the RF transmit signal 516 into the downconverter 506. For example, the loopback switch 508 is open or closed based on a loopback control signal 510 that in an exemplary embodiment is generated by a baseband processor (not shown). In an exemplary embodiment, the loopback switch 508 and the bypass switch 522 can be used to perform various calibrations on the transceiver 500. For example, the operations performed in an exemplary calibration mode are as follows.

1. Close loopback switch 508 and close bypass switch 522.
2. Perform DC offset measurement on self transmitted signal.
3. Open bypass switch 522 to enable DC offset filter 512 into circuit.
4. Perform DC offset measurement on self transmitted signal.
5. Set bypass switch 522 to obtain best performance based on the measurements taken.
6. Open loopback switch 508 for normal operating mode.
7. Perform above operations at startup, at regular intervals, or at specific times to maintain best receiver performance. For example, loopback calibration can be performed once per multiple packet times (once per few minutes as an example) within the preamble or within the Guard interval (GI) time between two data blocks.

Figure 6:
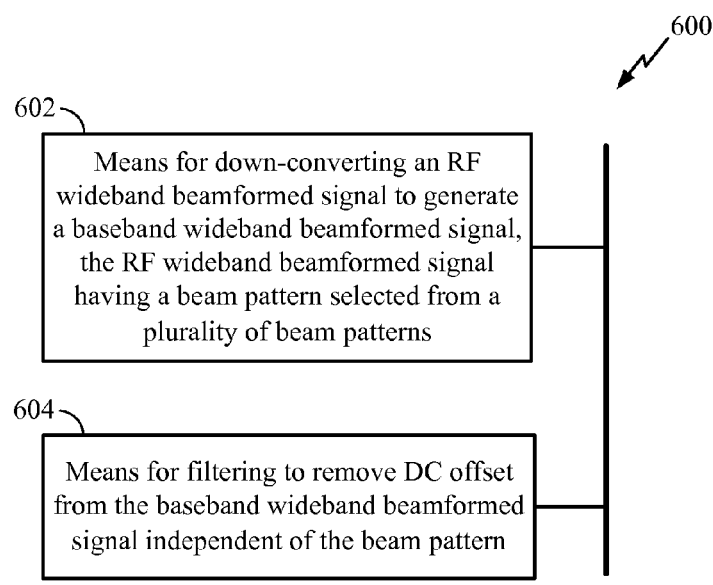
FIG. 6 shows an exemplary embodiment of an analog processing apparatus for use in a wide band beamforming receiver to reduce or remove DC offset.

FIG. 6 shows an exemplary embodiment of an analog processing apparatus for use in a wide band beamforming receiver to reduce or remove DC offset. For example, the apparatus 600 is suitable for use in the processing section 200 shown in FIG. 2 or the processing section 300 shown in FIG. 3. In an aspect, the apparatus 600 is implemented by one or more modules configured to provide the functions as described herein. For example, in an aspect, each module comprises hardware and/or hardware executing software.

The apparatus 600 comprises a first module comprising means (602) for down-converting an RF wideband beamformed signal to generate a baseband wideband beamformed signal, the RF wideband beamformed signal having a beam pattern selected from a plurality of beam patterns, which in an aspect comprises the mixers 204.

The apparatus 600 also comprises a second module comprising means (604) for filtering to remove DC offset from the baseband wideband beamformed signal independent of the beam pattern, which in an aspect comprises notch filters 210.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
   a first mixer configured to down-convert an RF wideband beamformed signal to generate a first baseband wideband beamformed signal, the RF wideband beamformed signal having a beam pattern selected from a plurality of beam patterns;
   a DC blocking capacitor connected between an output of the first mixer and an input of a baseband filter, the DC blocking capacitor forming a notch filter that is configured to remove DC offset from the first baseband wideband beamformed signal independent of the beam pattern selection;
   a bypass switch connected across the DC blocking capacitor configured to operate in a bypass mode to bypass the DC blocking capacitor and to operate in a non bypass mode to enable the DC blocking capacitor to remove the DC offset; and
   a loopback switch configured to loop back RF wideband transmit signal to the input of the first mixer;
   wherein the apparatus is configured to:
      close the bypass switch and the loopback switch and perform a first DC offset measurement;
      open the bypass switch and perform a second DC offset measurement;
      set the bypass switch based on the first DC offset measurement and the second DC offset measurement; and
      open the loopback switch.

2. The apparatus of claim 1, the DC blocking capacitor having a capacitance value that provides a corner frequency of approximately 300 kHz.

3. The apparatus of claim 1, the bypass switch configured to operate in a loopback calibration mode to provide transceiver calibration.

4. The apparatus of claim 1, further comprising a second mixer configured to down-convert the RF wideband beamformed signal to generate a second baseband wideband beamformed signal that bypasses the DC blocking capacitor.

5. The apparatus of claim 4, further comprising a mode signal configured to enable the second mixer in a bypass mode and to disable the second mixer in a non bypass mode.

6. The apparatus of claim 1, the first mixer comprising a direct conversion mixer.

7. An apparatus comprising:
   means for down-converting an RF wideband beamformed signal to generate a baseband wideband beamformed signal, the RF wideband beamformed signal having a beam pattern selected from a plurality of beam patterns;
   means for notch filtering to remove DC offset from the baseband wideband beamformed signal independent of the beam pattern selection;
   a bypass switch configured to selectively bypass the means for notch filtering during a bypass mode and for enabling the means for notch filtering to remove the DC offset; and
   a loopback switch configured to selectively providing a RF wideband transmit signal along with the RF wideband beamformed signal;
   means for closing the bypass switch and the loopback switch and performing a first DC offset measurement;
   means for opening the bypass switch and performing a second DC offset measurement;
   means for setting the bypass switch based on the first DC offset measurement and the second DC offset measurement; and
   means for opening the loopback switch.

8. The apparatus of claim 7, the means for notch filtering comprises the DC blocking capacitor connected between an output of the means for down-converting and an input of a baseband filter.

9. The apparatus of claim 8, the DC blocking capacitor having a capacitance value that provides a corner frequency of approximately 300 kHz.

10. The apparatus of claim 7, the means for down-converting comprising a direct conversion mixer.

* * * * *